(12) United States Patent
Low et al.

(10) Patent No.: US 8,181,146 B1
(45) Date of Patent: May 15, 2012

(54) EQUIVALENCE CHECKER

(75) Inventors: Yau Loong Low, Ipoh (MY); Wai Loon Ho, Ipoh (MY)

(73) Assignee: Altera Corporation, San Jose, CA (US)

(*) Notice: Subject to any disclaimer, the term of this patent is extended or adjusted under 35 U.S.C. 154(b) by 618 days.

(21) Appl. No.: 12/277,131

(22) Filed: Nov. 24, 2008

Related U.S. Application Data

(60) Provisional application No. 60/990,213, filed on Nov. 26, 2007.

(51) Int. Cl.
*G06F 17/50* (2006.01)
(52) U.S. Cl. ......... 716/136; 716/104; 716/111; 716/132
(58) Field of Classification Search .................. 716/104, 716/111, 132, 136
See application file for complete search history.

(56) References Cited

U.S. PATENT DOCUMENTS 7,661,050 B2 * 2/2010 Huben et al. .................. 714/733

* cited by examiner

*Primary Examiner* — Thuan Do
(74) *Attorney, Agent, or Firm* — Womble Carlyle Sandridge & Rice LLP

(57) ABSTRACT

A method for performing equivalency checking between circuit designs is provided. The method includes partitioning the circuit designs into logic cones. The method includes comparing corresponding logic cones for equivalency. The comparing includes identifying constant registers feeding nonequivalent logic cones, and propagating a constant value associated with the constant register. The method includes repeating the comparing with the propagated constant values inserted in one of the corresponding logic cones. The method also includes detecting duplicate registers feeding nonequivalent logic cones in embodiments where no constant registers feeding nonequivalent logic cones are found.

19 Claims, 5 Drawing Sheets

EQUIVALENCE CHECKER

CROSS REFERENCE TO RELATED APPLICATIONS

This application claims priority from U.S. Provisional Patent Application No. 60/990,213, filed Nov. 26, 2007, and entitled "Advanced Equivalence Checker with Constant and Duplicate Register Detection Ability." This provisional application is herein incorporated by reference.

BACKGROUND

Equivalence checking is a form of static verification that employs formal, mathematical techniques to prove that two versions of a circuit design are, or are not, functionally equivalent. Thus, in circuit design typically once a design has undergone significant transformations equivalence checking tools are employed to verify that the new design is functionally equivalent to the previous design. Through equivalence checking the verification of the circuitry changes in the implementation phase of logic optimization, technology mapping, and place and route, are each handled. One of the shortcomings of equivalence checking tools is the production of a non-equivalent result when the designs are indeed equivalent, this may be referred to as a false-difference. Typically, a user's hints and settings are often required to guide an equivalence checking tool to the correct result. In addition, too many instances of registered duplication and reduction may become frustrating to users to the point where it is inefficient to use an equivalence checking tool.

It is in this context that the embodiments arise.

SUMMARY

Embodiments of the present invention provide a method and a framework for performing equivalency checking for a circuit design. It should be appreciated that the present invention can be implemented in numerous ways, such as a process, an apparatus, a system, a device or a method on a computer readable medium. Several inventive embodiments of the present invention are described below.

In one aspect of the invention, a method for performing equivalency checking on circuit designs is provided. The method includes subdividing the circuit design into logic cones and mapping compare points between the circuit designs. In one embodiment, the compare points are arranged in an input-output order. The compare points of the corresponding designs are checked for equivalency. When checking for equivalency, constant registers feeding not equal logic cones are identified, as well as duplicate registers feeding not equal logic cones. The identified constant registers and duplicate registers have constant values propagated and duplicate registers mapped as compare points, respectively, and the designs are compared again in order to provide more accurate results of the equivalence check.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

The embodiments described herein provide a tool for simplifying the design of integrated circuits. It will be obvious, however, to one skilled in the art, that the present invention may be practiced without some or all of these specific details. In other instances, well known process operations have not been described in detail in order not to unnecessarily obscure the present invention.

The embodiments described herein provide an equivalence checking tool that can intelligently detect duplicate and stuck-at constant registers without additional settings from a user. In these embodiments, the equivalence checker is configured to minimize a user's efforts and at the same time maximize the accuracy of the results by eliminating false differences arising from register duplication and identification of constant registers to reduce the complexity and size of a logic cone. As used herein, a logic cone may be groups of logic ordered by registers, ports, or black boxes. The output of a logic cone may be referred to as a compare point.

Figure 1:
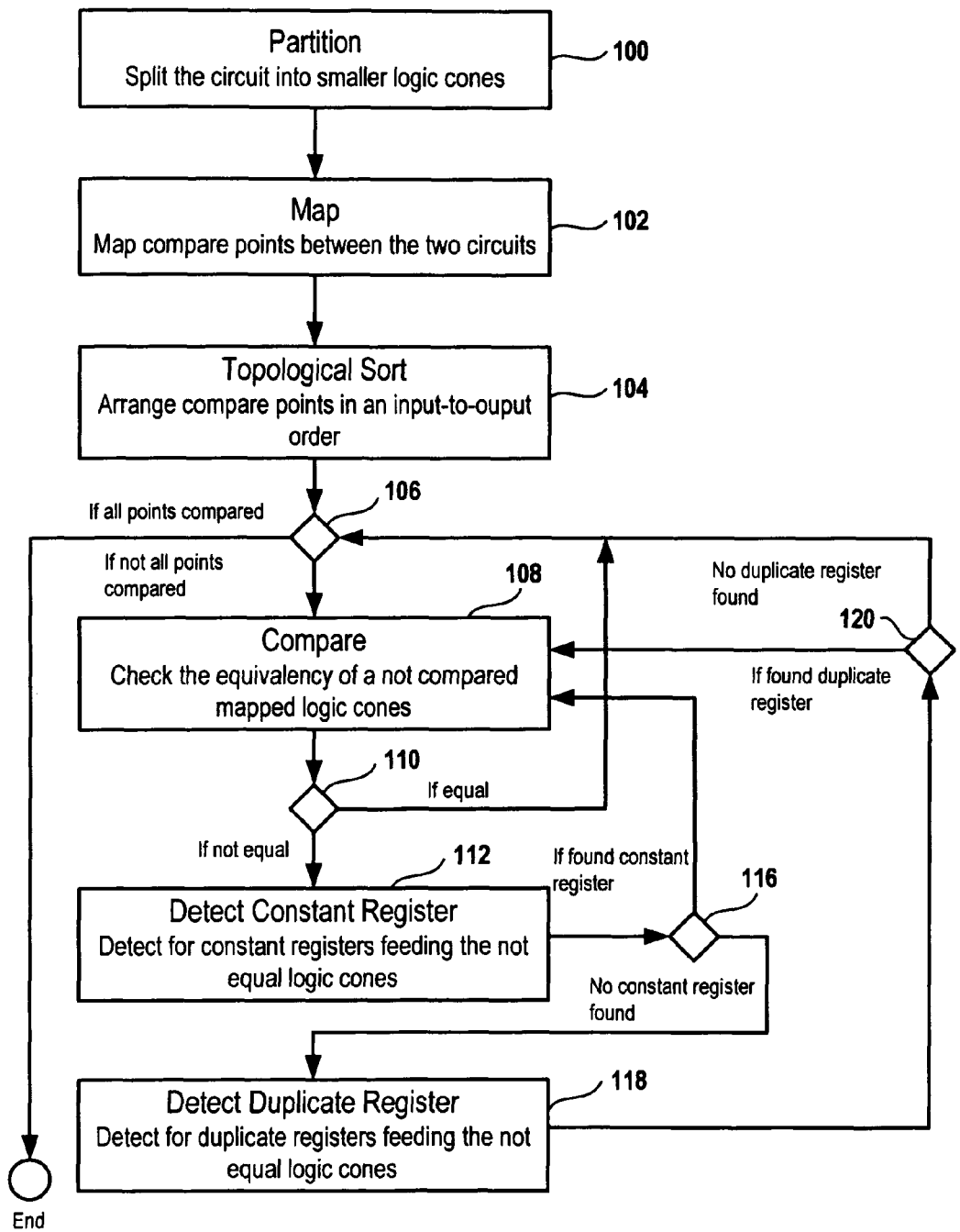
FIG. 1 is a flow chart diagram illustrating the method operations for efficiently performing an equivalence check of circuit designs in accordance with one embodiment of the invention.

FIG. 1 is a flow chart diagram illustrating the method operations for efficiently performing an equivalence check of circuit designs in accordance with one embodiment of the invention. In the embodiments discussed herein, the equivalence checker eliminates the dependency on users settings by introducing two components which detect constant and duplicate registers automatically. The method initiates with operation 100 where the circuit designs are partitioned. In this operation, the circuit is split into smaller logic cones through the partitioning operation. In essence, the circuit is divided into smaller logic cones and instances such as pins, registers, and module primitives will become hard boundaries of the partition and may act as compare points. The method then advances to operation 102 where the compare points between the two circuit designs are mapped. In one embodiment, the compare points between the two circuit designs are mapped through a name-based algorithm. In another embodiment, the mapping may be performed through a structurally based algorithm. It should be appreciated in the mapping operation the tool attempts to match or pair compare points from a reference design to corresponding compare points within the new design being test for functionality and equivalence.

The method of FIG. 1 then advances to operation 104 where a topological sort is performed to arrange compare points in an input to output order. In operation 104, the partitioned logic cones are arranged in the input to output order to ensure that all the source compare points have been compared before the comparing of the compare points being fed. The topological sort operation arranges the compare points in order to reduce or eliminate, if possible, the need to compare the logic cones after the detection of stuck at constant registers and duplicate registers. The method then advances to decision operation 106 where it is determined if all points have been compared. If all points have been compared, the method terminates. If all points have not been compared, the method advances to operation 108 where a comparison is performed to check the equivalency to a not-compared map logic cone.

In one embodiment, a comparator engine of the equivalence checker uses a combination of binary decision diagram (BDD) and boolean satisfiability (SAT) as the basis to verify the equivalence of the two comparing logic cones in operation 108. It should be appreciated that other methods and algorithms are available to verify the equivalence of the logic cones, such as, automated test pattern generation (ATPG). In one embodiment, BDD and SAT may be selected due to improved processing time and results. In compare operation 108, if a compare point is found to be not equivalent, all the register support points, i.e., compare points that feed the not-equivalent logic cone, will be checked for stuck at constant conditions in operation 112. It should be appreciated that decision operation 110 determines if a compare point is found to be equal or not. If the compare point is equal in operation 110, the method returns to decision operation 106 and repeats as discussed above. If the compare points are not equal, then the method advances to operation 112 where the compare points are checked for stuck at constant conditions.

In one embodiment, the criteria for determining a stuck at constant register are derived based on the characteristic and functions of a register. For instance, if a register has a $V_{cc}$ signal feeding a pre-set port and a GND signal feeding a clear port, the register is characterized as being stuck at $V_{cc}$. In addition, one skilled in the art will appreciate that the checking for constant input signals is not limited to the immediate source only. A cone of combinational logic may also be checked if it could be reduced to a constant by using BDD and SAT. In addition, the checking for constant registers is also not limited to the immediate support points of the not-equivalent logic cone only. The scope of the checking could go beyond the immediate support points by applying the same constant checking method on the logic cones beyond the immediate support points in one embodiment. In another embodiment, the maximum depth level is configured by a user. In embodiments where run time is a concern, the maximum depth level may be defaulted to one.

If a constant register is found as determined through decision operation 116 the method will return to the comparison operation 112 and repeat as described above. It should be noted that the constant register is identified and will not be characterized as not equal in the next pass. If no constant registers are found as determined through decision operation 116, the method moves to operation 118 where duplicate registers are detected. In operation 118, if a compare point is found not to be equivalent, all the non-mapping register support points (compare points that feed the not-equivalent logic cone) are checked for a duplicate condition. Registers that have been detected as stuck at constant will not be checked for duplicate conditions in order to save run time. In operation 118 the detection of the duplicate registers will first process the reference circuit. When processing the reference circuit, reference non-mapping register support points are temporarily mapped with one of the processed register support points. Process non-mapping registers will have a higher priority than mapping registers, in one embodiment. The equivalence check is performed on the temporary comparing logic cone by using the comparator engine as described above. The next processed register support point is then checked as described above until an equivalent comparing logic cone is found. The process circuit is then checked for process non-mapping register support points temporarily mapped with one of the reference mapping register support points. Equivalence checks on this temporary comparing logic cone proceed through the use of the comparator engine. It should be appreciated that the above-described methodology may be recursively called if the temporary comparing logic cone is found to be not equivalent.

Should any duplicate registers be found in operation 118, then through decision operation 120 the method returns to compare operation 108 and repeats as described above. If no duplicate registers are found, then the method returns to decision operation 106 and repeats as discussed above. It should be appreciated that if any of the register support points are detected for having stuck at constant or duplicate conditions, all the not equal, and too large or too complex to be compared, logic cones fed by that support point would be compared again. In so doing, the duplicate or stuck at constant condition could be propagated to the not-equal logic cones and a more accurate result could be obtained through the assistance of this information. The propagated duplicate or constant condition can also help logic cones that are too large or too complex to be compared by reducing the complexity and size of the logic cones. Therefore, through the embodiments described herein, logic cones previously too large to be checked may be reduced in order to be checked for functional equivalency.

Figure 2A:
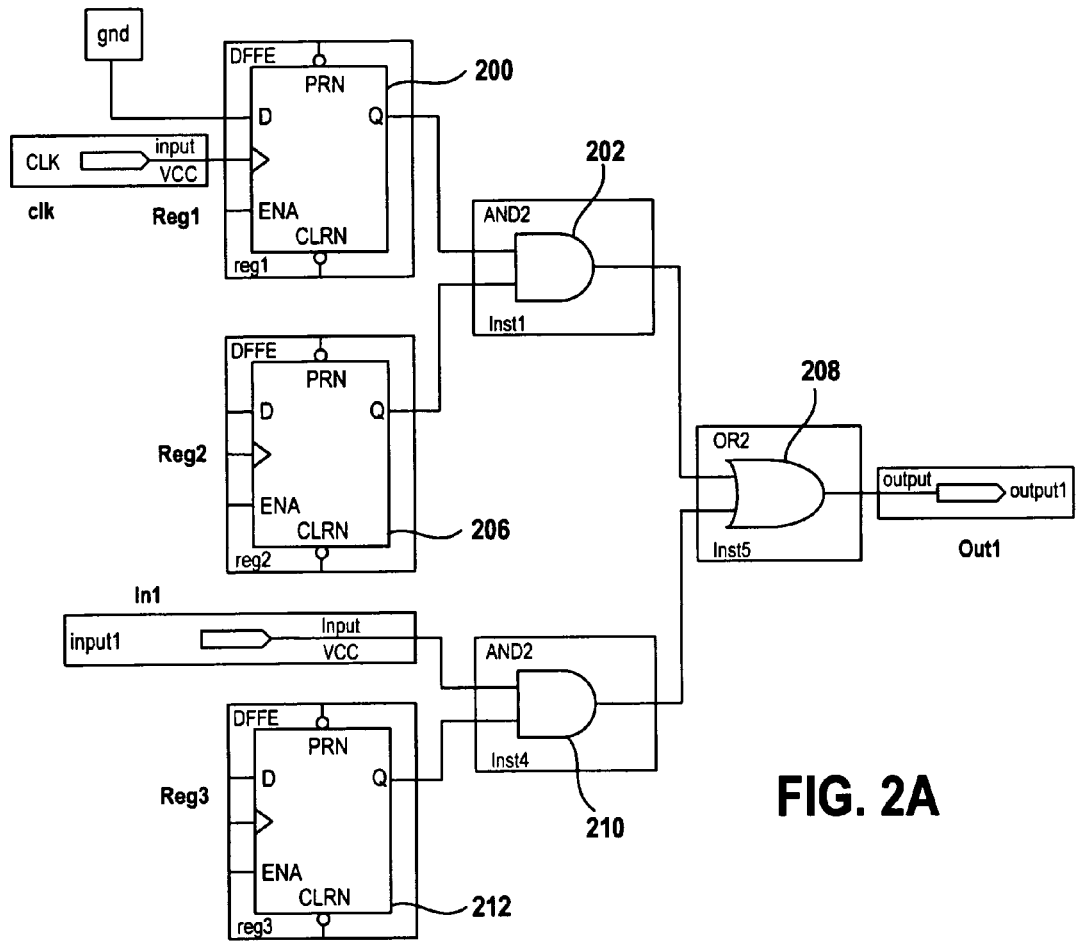
FIGS. 2A, 2B, and 3 are simplified schematic diagrams used to illustrate the stuck at constant register methodology performed by the constant register detection engine in accordance with one embodiment of the invention.
Figure 2B:
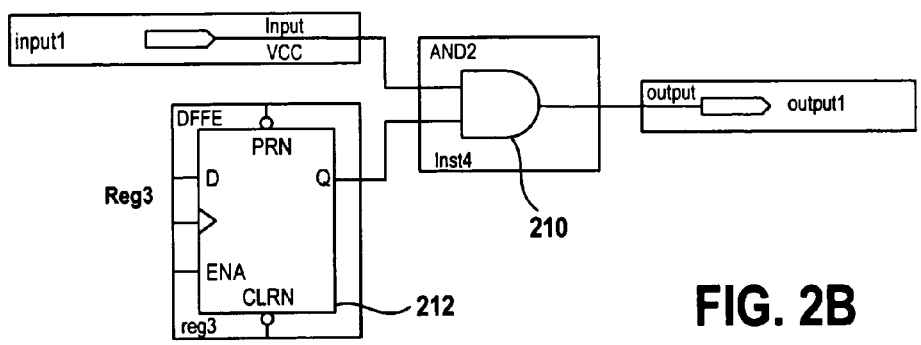
Figure 3:
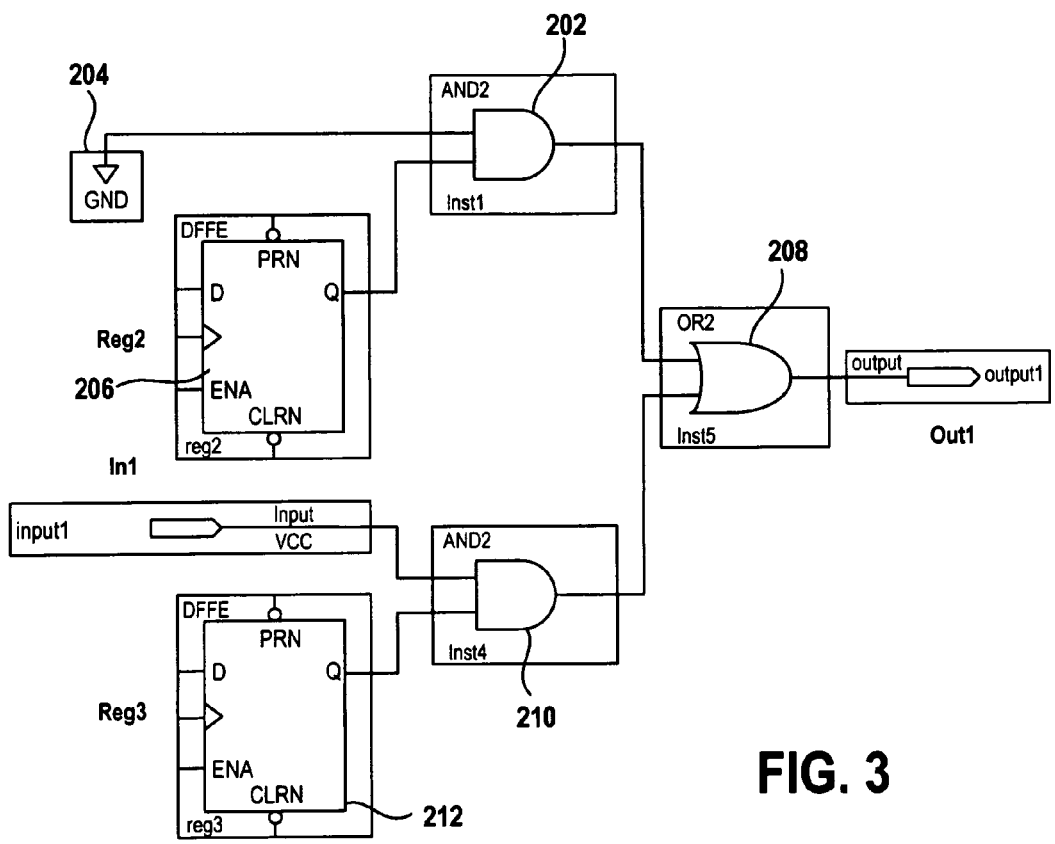

FIGS. 2A, 2B, and 3 are simplified schematic diagrams use to illustrate the stuck at constant register methodology performed by the constant register detection engine in accordance with one embodiment of the invention. FIG. 2A illustrates a reference logic cone for a non-optimized net list, while FIG. 2B illustrates a processed logic cone for an optimized net list. FIGS. 2A and 2B appear to be not equivalent, however, through the embodiments described herein the stuck at constant condition for register 1 200 is detected in order to accurately compare the reference and processed logic cones of FIGS. 2A and 2B. The ground signal to register 1 200 enables the reference logic cone of FIG. 2A to be represented as the reference logic cone of FIG. 3. In FIG. 3, AND gate 202 receives the ground signal 204 and the output of register 2 206 as inputs. Thus, the output of AND gate 202 is always 0, which is one input to OR gate 208. Consequently, the output of OR gate 208 is dependent on the output of AND gate 210. AND gate 210 receives the output of register 3 212 and input 1. Accordingly, through the propagation of the constant value, the reference logic cone of FIG. 3 is equivalent with the processed logic cone of FIG. 2A.

Figure 4A:
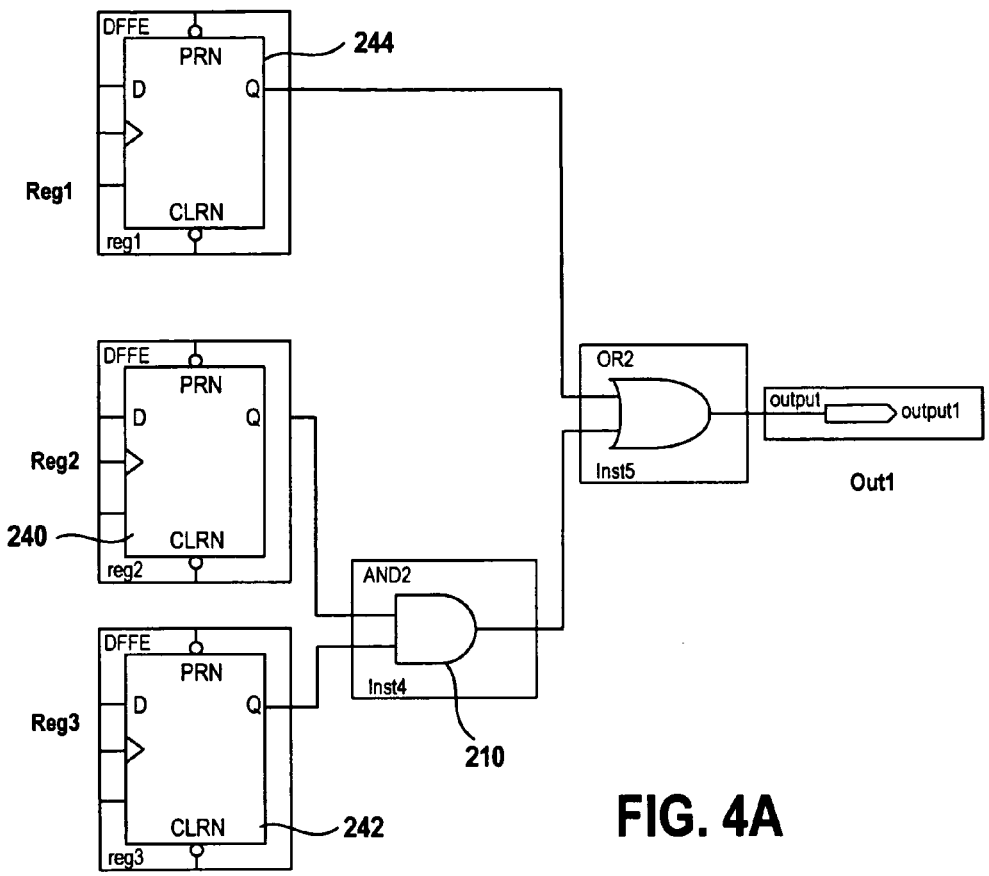
FIGS. 4A, 4B, and 5 are simplified schematic diagrams illustrating a technique for detecting duplicate registers in accordance with one embodiment of the invention.
Figure 4B:
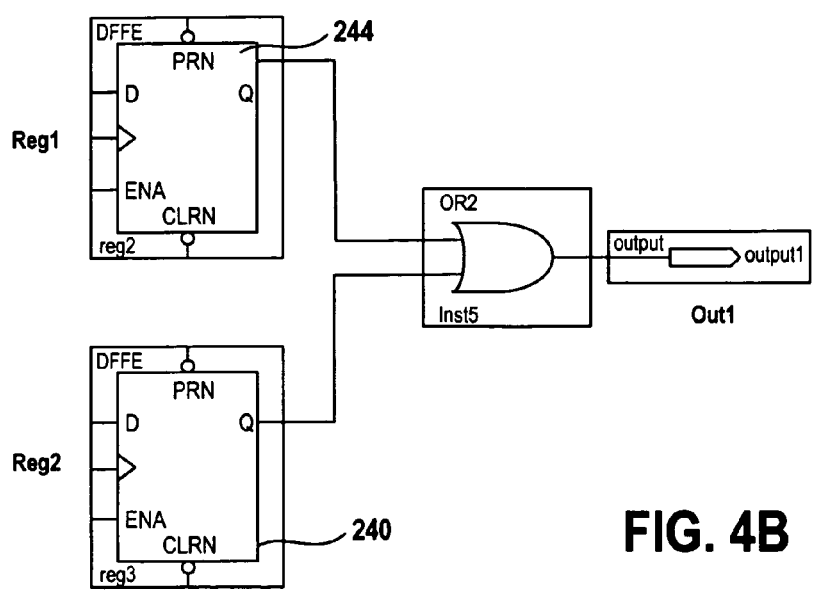
Figure 5:
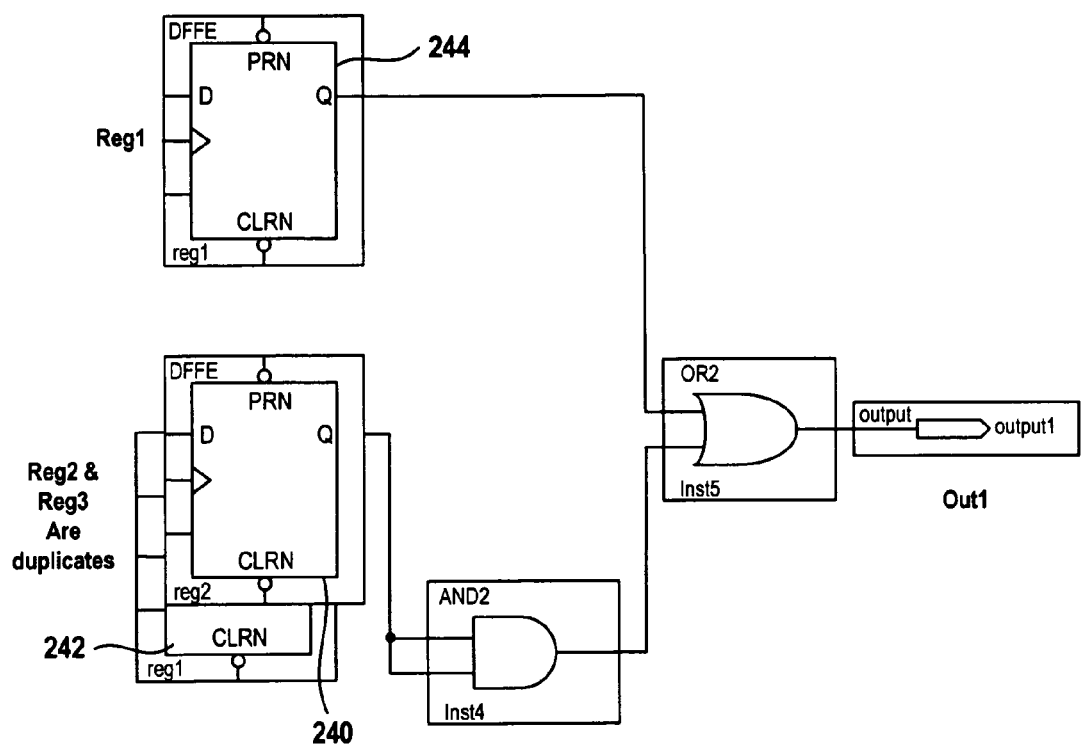

FIGS. 4A, 4B, and 5 are simplified schematic diagrams illustrating a technique for detecting duplicate registers in accordance with one embodiment of the invention. FIG. 4A illustrates a reference logic cone for a non-optimized net list, while FIG. 4B illustrates a processed logic cone for an optimized net list. FIGS. 4A and 4B appear to be not equivalent, however, through the embodiments described herein duplicate registers 240 and 242 are detected. As mentioned above with reference to operation 118 of FIG. 1, register 242 of FIG. 4A is identified as a non-mapping register that may be a duplicate of register 242 or 244. The non-mapping register support point of register 240 is temporarily mapped with one of the processed register support points, e.g., register 242. An equivalence check is performed through a comparator engine and register 240 is detected as a duplicate of register 242. As illustrated in FIG. 5, the reference logic cone is updated so that registers 240 and 242 are mapped as a compare point. Consequently the referenced logic cone of FIG. 5 is now equivalent to the processed logic cone of FIG. 4B. As mentioned above, if any of the "register" support points is detected for having duplicate conditions, all the not-equal and too large or too complex to be compared logic cones fed by that support point would be compared again. By doing so, the duplicate condition could be propagated to the not-equal logic cones and a more accurate result could be obtained through the additional information. The propagated duplicate condition may also cause logic cones that are too large or too complex to be compared to be simplified by reducing the complexity and size of the logic cones.

Tables 1 and 2 illustrate exemplary results of the use of the embodiments described herein and the improvement on the accuracy of the equivalence checking. As illustrated in Table 1, the constant and duplicate register detection embodiments detected 41 designs that were undetected and one design that was undecided without the constant and duplicate register detection.

TABLE 1

|  | Without constant and duplicate register detection | | With constant and duplicate register detection | |
| --- | --- | --- | --- | --- |
|  | Number of designs | % | Number of designs | % |
| Equivalent | 118 | 65.19% | 160 | 88.40% |
| Not Equivalent | 41 | 22.65% | 0 | 0.00% |
| Undecided | 1 | 0.55% | 0 | 0.00% |
| Combinational Loop | 21 | 11.60% | 21 | 11.60% |

Table 2 illustrates further details of the 41 undetected designs and the one undecided design. That is, the number of constant registers detected and the number of duplicate registers detected for each design is listed.

| DESIGN | Without constant and duplicate register detection Result | With constant and duplicate register detection | | |
| --- | --- | --- | --- | --- |
|  |  | Result | Num. of Constant Registers Detected | Num. of Duplicate Registers Detected |
| c00906 | NEQ | EQ | 4 | 0 |
| da_designs/alt_sonet | NEQ | EQ | 1 | 0 |
| da_designs/bfyx | NEQ | EQ | 12 | 15 |
| da_designs/chip_ficon_40 | NEQ | EQ | 6 | 0 |
| da_designs/core_strip | NEQ | EQ | 0 | 2 |
| da_designs/hda_top | NEQ | EQ | 1 | 16 |
| da_designs/ibus_switch | NEQ | EQ | 2 | 0 |
| da_designs/logic_core | NEQ | EQ | 1 | 0 |
| da_designs/mpa_core | NEQ | EQ | 2 | 0 |
| da_designs/ppc_lan7 | NEQ | EQ | 0 | 16 |
| da_designs/tcp | NEQ | EQ | 4 | 0 |
| da_designs/tdm_phy_top | NEQ | EQ | 0 | 2 |
| da_designs/xbrg | NEQ | EQ | 0 | 4 |
| m3s000ct | UNDECIDED | EQ | 0 | 2 |
| st00153 | NEQ | EQ | 4 | 0 |
| st00158 | NEQ | EQ | 4 | 0 |
| st00206 | NEQ | EQ | 4 | 0 |
| top_level_ulc | NEQ | EQ | 51 | 24 |
| alt_corr_4096 | NEQ | EQ | 0 | 16 |
| alt_rapidio2 | NEQ | EQ | 3 | 0 |
| ap | NEQ | EQ | 47 | 414 |
| bfyx_top | NEQ | EQ | 12 | 15 |
| chip_ficon_40 | NEQ | EQ | 6 | 0 |
| dem_code | NEQ | EQ | 2067 | 46 |
| fcp_fpga | NEQ | EQ | 90 | 56 |
| ig | NEQ | EQ | 5 | 6 |
| mbc | NEQ | EQ | 1 | 0 |
| me1_corrected | NEQ | EQ | 2 | 0 |
| nac | NEQ | EQ | 1 | 0 |
| posmac3_top_corrected | NEQ | EQ | 12 | 0 |
| prmux | NEQ | EQ | 2 | 0 |
| rxpci_core | NEQ | EQ | 0 | 6 |
| s4_top | NEQ | EQ | 2 | 36 |
| sem1000 | NEQ | EQ | 15 | 32 |
| teradyne | NEQ | EQ | 0 | 4 |
| top_pl4_tx_drate1000_wid6_sepfifo4 | NEQ | EQ | 0 | 101 |
| tte | NEQ | EQ | 3 | 18 |
| vtp9 | NEQ | EQ | 36 | 0 |
| xbrg | NEQ | EQ | 0 | 4 |
| yangtze | NEQ | EQ | 0 | 4 |
| s1_top | NEQ | EQ | 2 | 0 |
| irte_fpga_struct_asicmm | NEQ | EQ | 9 | 4 |

The embodiments, thus far, are described with respect to PLDs. The method and apparatus for in-system programmability described herein may be incorporated into any suitable circuit. For example, the method and apparatus may be incorporated into other types of devices such as a programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be the programmable logic devices owned by the assignee.

Any of the operations described herein that form part of the invention are useful machine operations. The invention also relates to a device or an apparatus for performing these operations. The apparatus can be specially constructed for the required purpose, or the apparatus can be a general-purpose computer selectively activated, implemented, or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for performing equivalency checking between circuit designs, the method executed by one or more processors configured to perform a plurality of operations, the operations comprising:

partitioning a first circuit design into first logic cones, wherein each first logic cone comprises at least one first compare point associated therewith;

partitioning a second circuit design into second logic cones, wherein each second logic cone comprises at least one second compare point associated therewith;

comparing the first and second logic cones for equivalency by determining whether the at least one first compare point is equal to the at least one second compare point;

in response to a determination that the first compare point is not equal to the at least second compare point, identifying stuck-at constant registers feeding a nonequivalent logic cone among the first logic cones;

in response to a determination that the first compare point is not equal to the at least second compare point, propagating a constant value associated with the stuck-at constant registers; and in response to a determination that the first compare point is not equal to the at least second compare point, repeating the comparing of the first and second logic cones subsequent to inserting the propagated constant values in one of the first or second logic cones.

2. The method of claim 1, further comprising:

mapping the at least first compare point and the at least second compare point between the first and second circuit designs.

3. The method of claim 1, further comprising:

arranging the at least one first compare point and the at least one second compare point between the first and second circuit designs in an input-to-output order.

4. The method of claim 1, wherein in response to a determination that no stuck-at constant registers feed the nonequivalent logic cone, the method further comprises:

detecting duplicate registers feeding the nonequivalent logic cone.

5. The method of claim 4, wherein the detecting includes:

identifying a non-mapping register associated with the first and second circuit designs;

substituting the non-mapping register with a mapping register; and equivalency checking the first and second logic cones with the mapping register.

6. The method of claim 5, wherein the substituting includes:

assigning a higher priority to the non-mapping register as compared to the mapping register.

7. The method of claim 5, further comprising:

repeating the comparing of the first and second logic cones for equivalency with the mapping register.

8. A method for performing equivalency checking between circuit designs, the method executed by one or more processors configured to perform a plurality of operations, the operations comprising:

partitioning a first circuit design into first logic cones, wherein each first logic cone comprises at least one first compare point associated therewith;

partitioning a second circuit design into second logic cones, wherein each second logic cone comprises at least one second compare point associated therewith;

comparing the first and second logic cones for equivalency by determining whether the at least one first compare point is equal to the at least one second compare point;

wherein the comparing further includes, in response to a determination that the first compare point is not equal to the at least second compare point, identifying stuck-at constant registers feeding the nonequivalent logic cone;

In response to a determination that the first compare point is not equal to the at least second compare point, propagating a constant value associated with the stuck-at constant registers; and repeating the comparing of the first and second logic cones with the propagated constant values inserted in one of the first or second logic cones;

in response to a determination that the first compare point is not equal to the at least second compare point, detecting duplicate registers feeding a nonequivalent logic cone among the first logic cones.

9. The method of claim 8, wherein the first and second logic cones are groups of logic bordered by one of registers, inputs or black boxes.

10. The method of claim 8, wherein the second circuit design includes an optimized netlist and the first circuit design corresponds to a pre-optimized timepoint.

11. The method of claim 8, wherein the detecting includes,
identifying a non-mapping register associated with the first and second circuit designs;
substituting the non-mapping register with a mapping register; and
equivalency checking the first and second logic cones with the mapping register.

12. The method of claim 1, wherein in response to a determination that a duplicate register is detected, the method includes
repeating the comparing of the first and second logic cones with a mapping register.

13. The method of claim 8, wherein a detected duplicate register is mapped as a compare point.

14. A non-transitory computer readable medium having program instructions for performing equivalency checking between circuit designs, comprising;
program instructions for partitioning a first circuit design into first logic cones, wherein each first logic cone comprises at least one first compare point associated therewith;
program instructions for partitioning a second circuit design into second logic cones, wherein each second logic cone comprises at least one second compare point associated therewith
program instructions for comparing the first and second logic cones for equivalency
by determining whether the at least one first compare point is equal to the at least one second compare point;
in response to a determination that the first compare point is not equal to the at least second compare point, program instructions for identifying stuck-at constant registers feeding a nonequivalent logic cone among at least the first logic cones;
in response to a determination that the first compare point is not equal to the at least second compare point, program instructions for propagating a constant value associated with the stuck-at constant registers; and
in response to a determination that the first compare point is not equal to the at least second compare point, program instructions for repeating the comparing of the first and second logic cones subsequent to inserting the propagated constant values in one of the first or second logic cones.

15. The non-transitory computer readable medium of claim 14, further comprising:
program instructions for mapping the at least first compare point and the at least second compare point between the first and second circuit designs.

16. The non-transitory computer readable medium of claim 14, further comprising:
program instructions for arranging the at least one first compare point and the at least one second compare point between the first and second circuit designs in an input-to-output order.

17. The non-transitory computer readable medium of claim 14, wherein in response to a determination that no stuck-at constant registers feed the nonequivalent logic cone, then the program instructions for comparing further includes,
program instructions for detecting duplicate registers feeding the nonequivalent logic cone.

18. The non-transitory computer readable medium of claim 17, wherein the program instructions for detecting includes,
program instructions for identifying a non-mapping register associated with the first and second circuit designs;
program instructions for substituting the non-mapping register with a mapping register; and
program instructions for equivalency checking the first and second logic cones with the mapping register.

19. The non-transitory computer readable medium of claim 14, further comprising:
program instructions for presenting results of the equivalency checking.

* * * * *